United States Patent
Chai et al.

(10) Patent No.: US 7,079,409 B2
(45) Date of Patent: Jul. 18, 2006

(54) APPARATUS AND METHOD FOR POWER SAVINGS IN HIGH-PERFORMANCE CAM STRUCTURES

(75) Inventors: Chiaming Chai, Chapel Hill, NC (US); Michael T. Phan, Apex, NC (US); Joel A. Silberman, Somers, NY (US); Carmen C. Sloan, Creedmoor, NC (US)

(73) Assignee: International Business Machines Corporation, Armonk, NY (US)

(*) Notice: Subject to any disclaimer, the term of this patent is extended or adjusted under 35 U.S.C. 154(b) by 64 days.

(21) Appl. No.: 10/899,358

(22) Filed: Jul. 26, 2004

(65) Prior Publication Data

US 2006/0018141 A1 Jan. 26, 2006

(51) Int. Cl.
  *G11C 15/00* (2006.01)
(52) U.S. Cl. ............... 365/49; 365/189.07; 711/108
(58) Field of Classification Search ............... None
  See application file for complete search history.

(56) References Cited

U.S. PATENT DOCUMENTS

| 5,592,407 | A | 1/1997 | Konishi et al. ............... 365/49 |
| 6,191,970 | B1 | 2/2001 | Pereira .......................... 365/49 |
| 6,243,280 | B1 | 6/2001 | Wong et al. ................... 365/49 |
| 6,317,350 | B1 * | 11/2001 | Pereira et al. ............... 365/49 |
| 6,385,071 | B1 | 5/2002 | Chai et al. ..................... 365/49 |
| 6,452,822 | B1 | 9/2002 | Chai et al. ..................... 365/49 |
| 6,477,071 | B1 | 11/2002 | Edman et al. ................. 365/49 |
| 6,577,519 | B1 | 6/2003 | Avramescu .................. 365/49 |

* cited by examiner

*Primary Examiner*—David Lam
(74) *Attorney, Agent, or Firm*—Joscelyn G. Cockburn; William N. Hogg

(57) ABSTRACT

This invention reduces power consumed during CAM search operations in a CAM/RAM structure utilizing a segmented match line structure. This device is useful when it is known that a portion or portions of the compare data inputs vary infrequently. The apparatus sometimes may be referred to as local match line hold latch, and is a device that stores the value of a local match line comparison result the first time that a search operation occurs, and will stay at that value until the value of the compare data in of the local match line changes.

18 Claims, 5 Drawing Sheets

APPARATUS AND METHOD FOR POWER SAVINGS IN HIGH-PERFORMANCE CAM STRUCTURES

FIELD OF THE INVENTION

This invention relates generally to an apparatus and method for searching CAM structures and, more particularly, to providing a local match line hold latch for power savings in searching high-performance CAM structures.

BACKGROUND OF THE INVENTION

A prior art CAM search operation is shown in FIGS. 1 and 2 which illustrate the manner in which a typical prior art search operation is performed. FIG. 1 is a diagram of a one row comparison of stored data against compare data inputs, while FIG. 2 shows the timing of such operation. During a search operation, MLRestb (match line restore) will go high enabling the ML match line to be pulled low, and the Compare_Enable will go high enabling the compare data to be driven onto the compare lines. While Compare_Enable is low, both compare lines are low, but when the Compare_Enable goes high, the search value is driven onto the proper compare line. If the compare data in value is high, the compare line true will be driven high; if the compare data in value is low, the compare line compliment will be driven high. The compare lines then drive a dual-rail XOR that will pull the match line low if the compare data "in" does not match the stored value.

When every bit on the match line matches its corresponding compare data, the match line will remain high. Match line evaluation circuitry is then used to send a 'HIT' signal to the output of the macro indicating that there was a match inside of the CAM. If one or more of the bits resulted in a mismatch, the match line will be pulled low, and the evaluation circuitry will send a 'MISS' result to the output of the CAM structure.

FIG. 3 shows a conventional prior art extension of the design in FIG. 1 where a match line is large enough to require segmentation for performance improvement. In this case, if one or more bits in group A mismatch, the local match line will be pulled low, and the ripple through circuit will pull the main match line low. The match line will then be evaluated by the same evaluation circuitry described above.

U.S. Pat. No. 6,452,822 B1 entitled "Segmented Match Line Arrangement For Content Addressable Memory" granted to Chai, et al on Sep. 17, 2002 and commonly assigned, which is incorporated herein by reference, states that a memory cell can be used in conjunction with a typical ripple through, such as in FIG. 3, to enable or disable the local match line comparison on a per-line basis. This is different from that of the current invention because it does not allow for storage and use of the previous local match line comparison result.

In both FIG. 1 and FIG. 3, power is consumed by charging and discharging the compare lines and by switching all of the local match lines, except for the ones that may result in a match. (Figures referred to are shown in question 3 below.)

SUMMARY OF THE INVENTION

The purpose of this invention is to reduce power consumed during CAM search operations in a CAM/RAM structure utilizing a segmented match line structure. This device is useful when it is known that a portion or portions of the compare data inputs vary infrequently. The apparatus sometimes may be referred to as local match line hold latch, and is a device that stores the value of a local match line comparison result the first time that a search operation occurs and will stay at that value until the compare data in value of the local match line changes.

DETAILED DESCRIPTION OF THE PREFERED EMBODIMENT(S)

The present invention relates to search operations in a CAM/RAM structure. By reducing the number of cells that are compared during a search operation, the overall power consumption can be greatly decreased. This is accomplished through the use of a local match line hold latch to separate those bits for which the compare data inputs do not change with every search operation from those bits for which the compare data inputs may change every search operation. By using this device and method for match line segmentation, the previous local match line comparison result can be stored and re-used for a succession of what would otherwise be identical local match line search results. This technique should be used in conjunction with the proper clocking techniques to achieve power savings. This technique also adds the same benefit as a ripple through circuit used to segment a large match line for performance improvement purposes. A typical ripple through circuit is shown schematically at 22, as well as LML restore circuit 24 and match line restore circuit 26. Such circuitry is found in U.S. Pat. No. 6,452.822.

Figure 1:
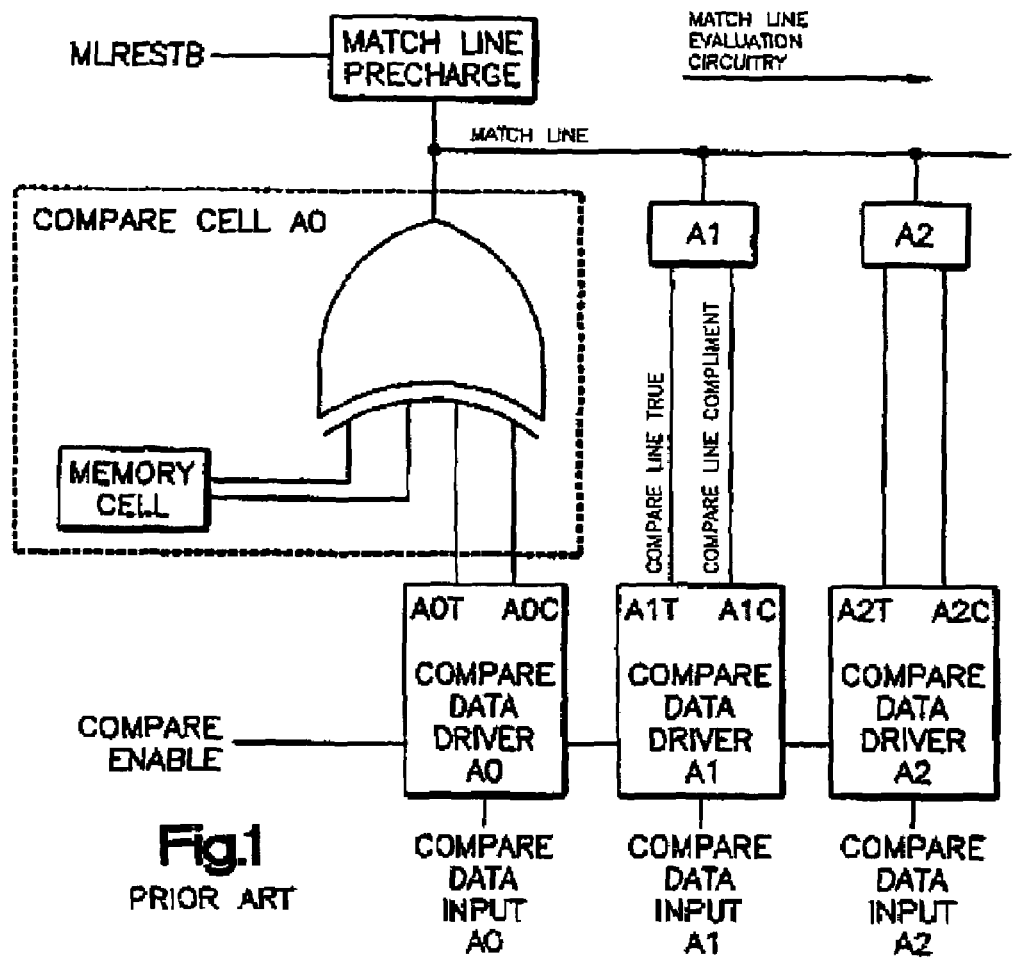
FIG. 1 is a diagrammatic representation of the manner in which one stored CAM entry is compared with the compared data input values.
Figure 2:
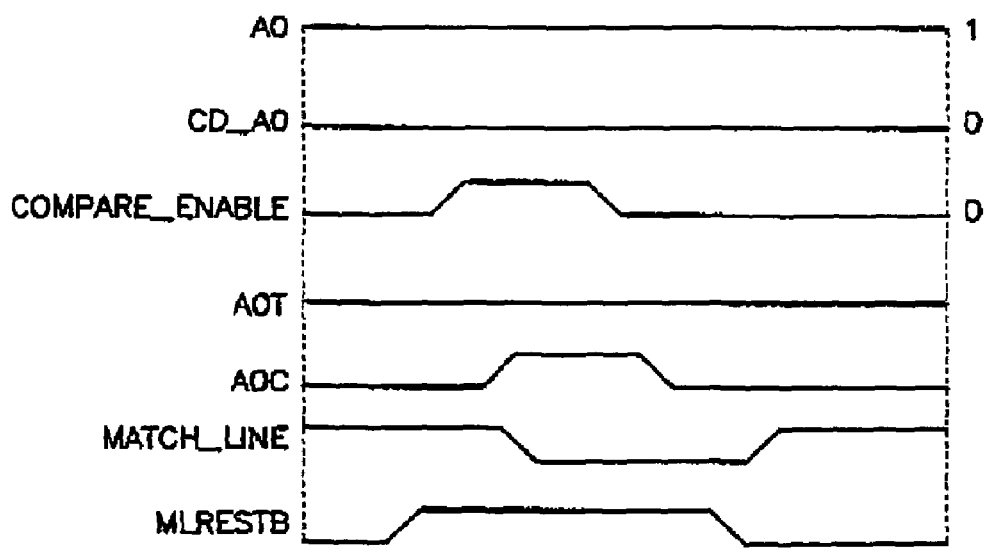
FIG. 2 is a timing diagram of the manner in which one prior art conventional search operation is performed.
Figure 3:
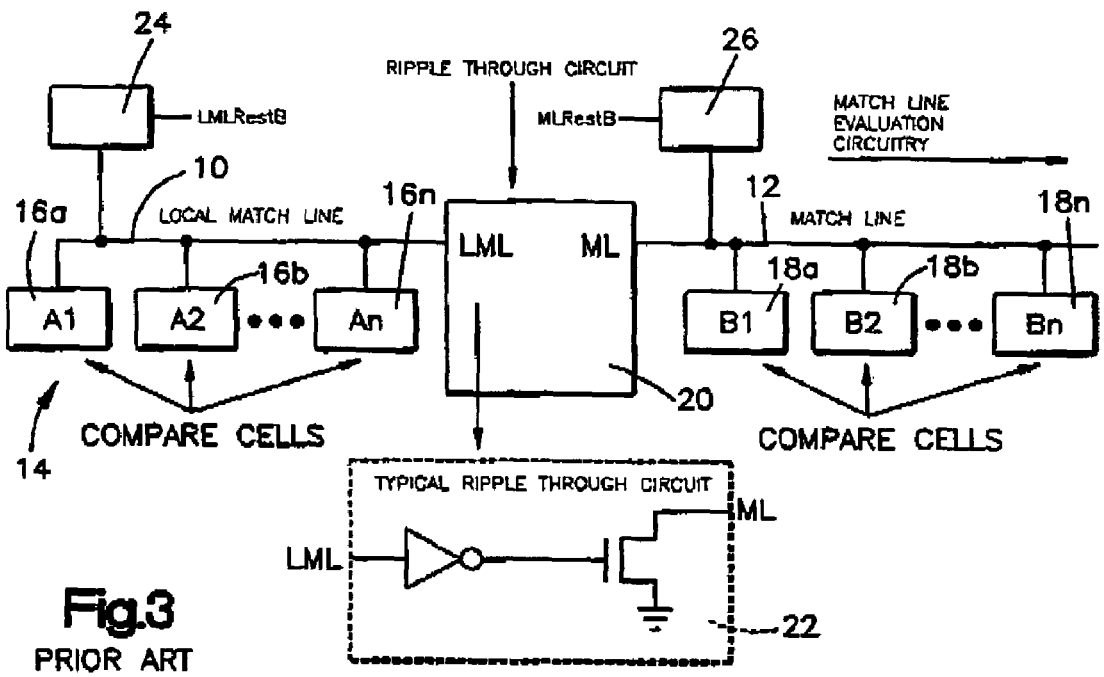
FIG. 3 shows the manner in which a large match line may be segmented or divided for performance improvement.
Figure 4:
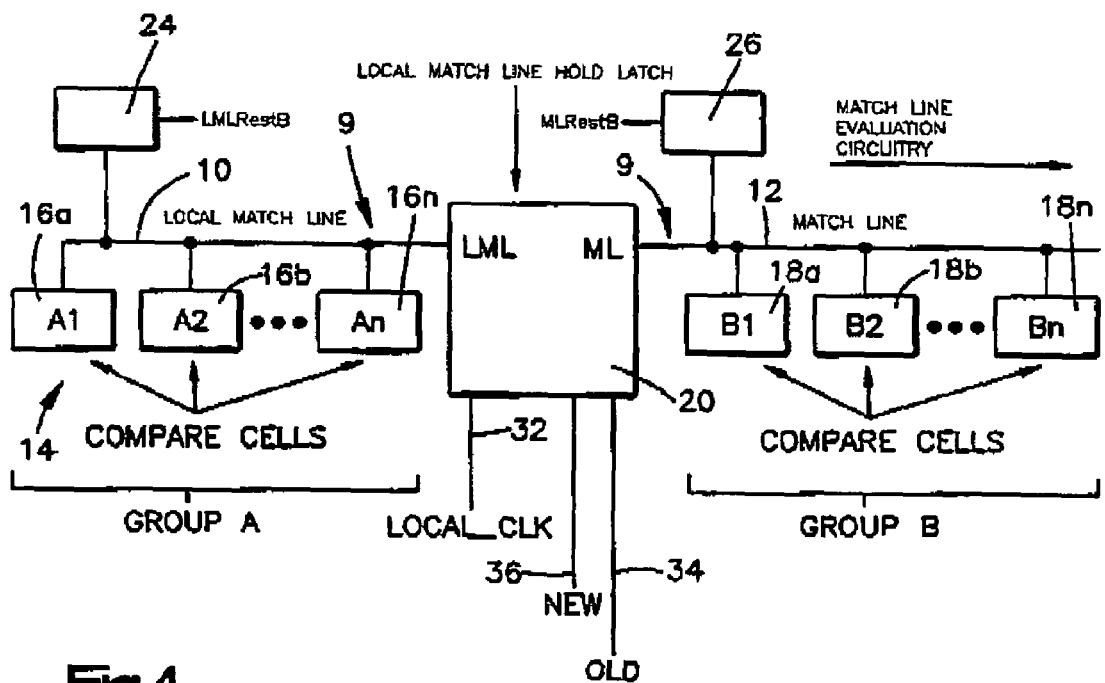
FIG. 4 illustrates one use of the present invention within a CAM structure.

FIG. 4 shows a segmented match line 9 comprised of a local match line (LML) 10 connected to a portion of CAM 14 containing compare cells 16a, 16b... 16n, sometimes referred to as group A, and a match line (ML) 12 connected to compare cells 18a; 18b... 18n, sometimes referred to as group B, connected to a different portion of CAM 14, where it is known that the compare data inputs for compare cells 16a... 16n (group A) vary infrequently. Knowledge that these inputs change infrequently is the basis for choosing which bits belong in this portion of the design. By using this segmentation method in conjunction with a local match line hold latch 20, and the proper clocking techniques, a significant amount of power savings can be achieved. This is especially true for CAM structures that are only expected to have one entry match per search operation In this case, because compare cells 16a . . . 16n (group A) compare data do not change often in values, the local match line 10 comparison result will be the same for successive search operations. The idea of the local match line hold latch 20 is that the value of the comparison will be stored in the hold latch 20 the first time that a search operation occurs and will stay at that value until the compare data changes in value. The hold latch 20 also needs to be updated during a search operation that follows a CAM write operation that updates the value stored in group A compare cells 16a . . . 16n.

FIG. 4 also shows the various inputs to the hold latch 20, and a high level depiction of certain parts of the hold latch 20. As can be seen, there is a local clock input 32, and "old" clock 34 and "new" clock 36. The local clock 32 enables the hold latch to store the state of the LML at a particular point in the cycle of a CAM search operation. When the local clock is enabled, the state of LML is stored in hold latch 20 as a "hit" or "miss". The "old" clock 34 and "new" clock 36 are generated from the result of a comparison (off-chip and not shown) of the next bits to be inputted to the compare data inputs associated with comparison cells 16a . . . 16n group A to the previous bits inputted to the compare data inputs associated with comparison cells 16a . . . 16n group A. The "new" clock 36 is named to signify that, when enabled, a new entire conventional search of the CAM structure will be performed. The "old" clock 34 is named to signify that, when enabled, the previous search result of the LML that is stored in hold latch 20 will be used as part of the CAM search operation and a new search of cells 16a . . . 16n will not be performed, thereby allowing for power savings. The "new" clock 36 is enabled when the off-chip comparison shows that the next bits to be inputted to the compare data inputs associated with comparison cells 16a . . . 16n group A do not match that of the most recent compare data inputs of the most recent search operation, and it is desired that the result of the current search of LML be used in the current search of the CAM. The "new" clock 34 would also be enabled for any first CAM search operation performed after a write operation to the CAM has been performed. When the "new" clock 36 is enabled, the local clock 32 will also be enabled, thus allowing the LML search result to be stored in hold latch 20. The "old" clock 34 is enabled when the off-chip comparison shows that the new compare data inputs match that of the most recent compare data inputs of the most recent search operation, and it is desired that the result of the most recent search of LML be used in the current search of the CAM, i.e. the value of the data stored in hold latch 20.

Figure 5:
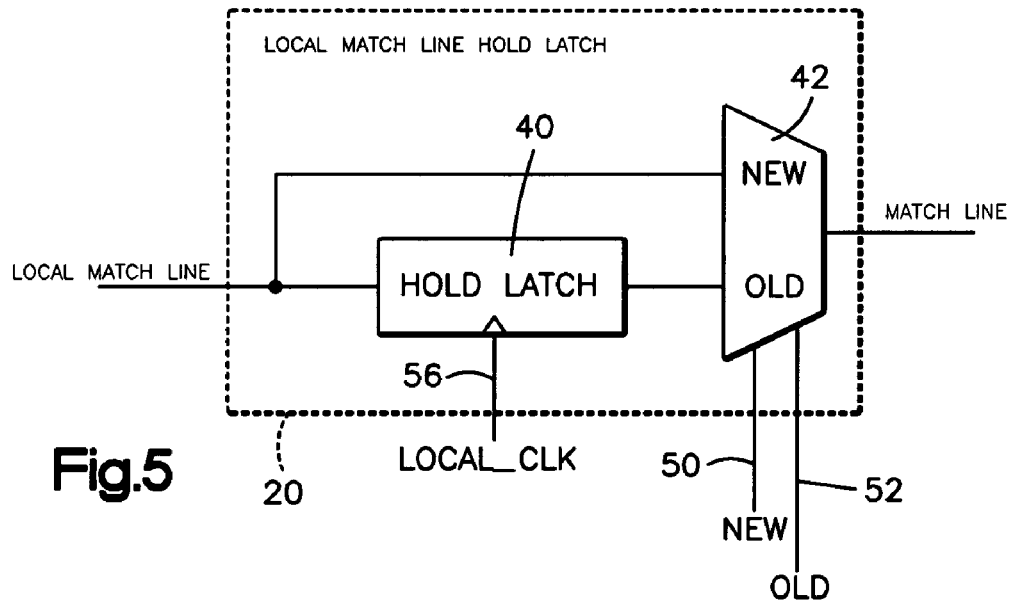
FIG. 5 is a block diagram of the present invention.

A block diagram of the local match line hold latch is shown in FIG. 5. As can be seen in FIG. 5, the local match line hold latch 20 includes a holding latch 40 which receives the local clock input 32, and a multiplexer 42 which receives the "old" data input 34 and the "new" data input 36 which, as is well known, controls the outputting of either the "old" data 34 or the "new" data 36 to the match line 12.

Figure 6:
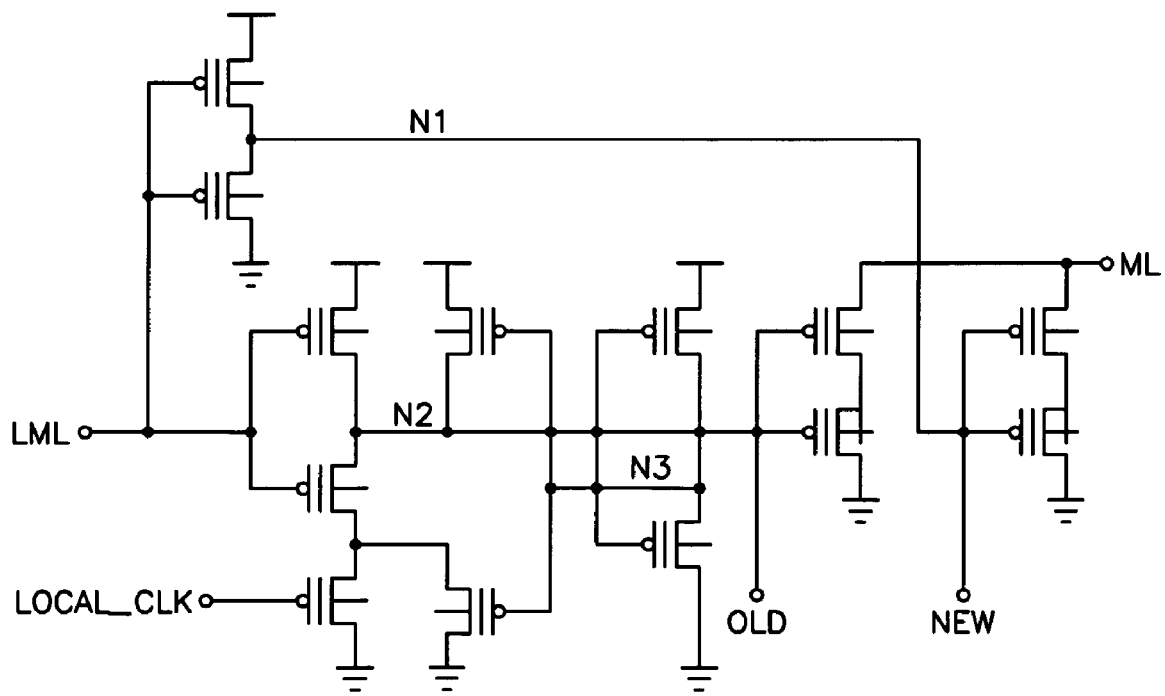
FIG. 6 is a transistor level circuit diagram of the present invention.

While FIG. 6 shows a specific circuit implementation using PFET and NFET transistors, any hold latch and any means of driving the final match line would allow for taking advantage of this invention. Since this is within the skill of an artisan, no detailed description of FIG. 6 is believed to be necessary.

In order to accomplish the power savings, an external enable or other means of detecting that a comparison update is needed will control the NEW 50, OLD 52, LOCAL 54, LOCAL-CLK 56, Compare-Enable 58, and LMLRestb 60 signals. The following is a description of how the signals need to be controlled in different situations.

During a search operation that requires an update of the local match line 10 comparison: Compare_Enable 58 will go high, allowing the comparison to occur. LMLRestb 60 will go low, allowing the ML 12 to be discharged if there is a mismatch of one of the bits in comparison cells 16a . . . 16n group A. LOCAL_CLK 56 is enabled, allowing the new compare result to be stored in the hold latch 20. NEW 50 will go high, allowing the new comparison result to be rippled onto the main match line. OLD will remain low During a search operation that uses the same compare data inputs for comparison cells 16a . . . 16n group A as the previous search operation, Compare_Enable 58 will be low so that no compare lines in the local match line group will be driven high. LMLRestb 60 will remain low in order to keep the local match line at the precharge state. LOCAL_CLK 56 will be held low in order to maintain the previous comparison result. NEW 50 will be held low, and OLD 52 will go high, allowing the previous comparison result to be rippled onto the main match line 12.

By using the above clocking techniques, along with the local match line hold latch 20, power savings can be achieved. During a successive search operation that would otherwise result in the same local match line comparison, i.e., lines from group A will not be driven, and the local match lines will not switch. This is unlike the traditional ripple through, where compare lines will switch and all local match lines 16 . . . 16n and 18a . . . 18n could potentially switch as shown in U.S. Pat. No. 6,452,822 B1.

Figure 7:
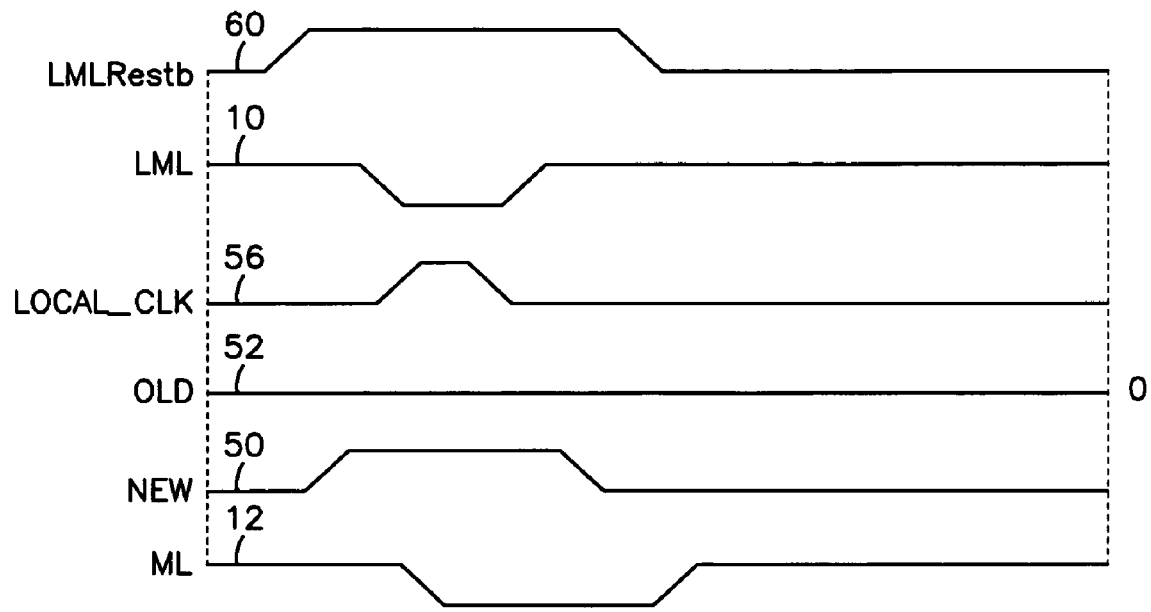
FIG. 7 is a timing diagram of a NEW search operation that results in a mismatch of the local match line only according to this invention.

The following is a description of different examples of search operations that utilize the present invention with reference to FIGS. 7–10:

1. CAM search with NEW compare data that results in a mismatch of the local match line 10. This case is shown in FIG. 7 of the figures. It is performed like any normal search operation—all comparisons are performed. The NEW 50 signal goes high allowing a ripple through of the new comparison result. A mismatch is found on the local match line pulling the main match line to a zero state. A miss value is stored in the hold latch. Then both match lines are restored high.

Figure 8:
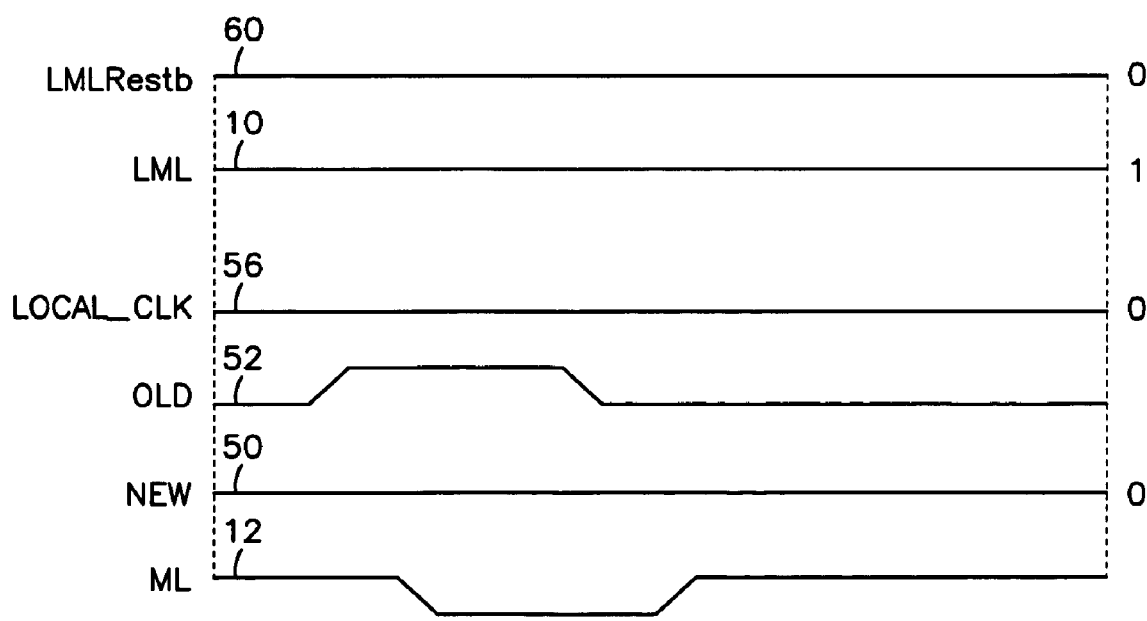
FIG. 8 is a timing diagram of an OLD search operation that results in a mismatch as a result of the stored comparison value according to this invention.

2. CAM search using OLD comparison result where previous compare was a mismatch. This example is illustrated in FIG. 8 of the diagrams. It shows that while the LML remains high and the LOCAL_CLK remains low, the main match line still goes low because OLD goes high, allowing the value of the previous compare onto the main match line.

Figure 9:
FIG. 9 is a timing diagram of a NEW search operation that results in a match according to this invention.

3. CAM search with NEW compare data that results in a match of the local match line. This is shown in FIG. 9. A comparison is done and all bits match, so the local match line remains high. The LOCAL CLK is enabled, storing a match value in the hold latch. When the NEW signal goes high, the main match line remains high because the local match line comparison resulted in a match and there were no mismatches on the main match line.

Figure 10:
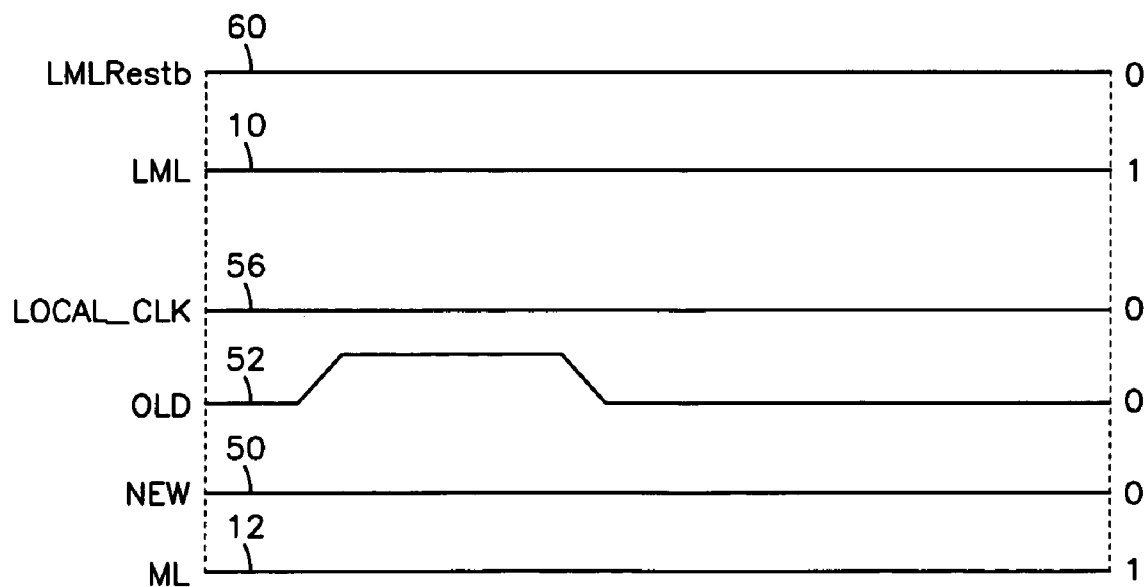
FIG. 10 is a timing diagram of an OLD search operation that results in a match as a result of the stored comparison value according to this invention.

4. CAM search using OLD comparison result where the previous compare was a match. This is shown in FIG. 10. The local match line remains high, the LOCAL CLK is not enabled, and only the OLD signal goes high. The main ML remains high because a match value is stored in the hold latch and there were no mismatches on the main match line.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A system comprising a content addressable memory (CAM) having a first data field and a second data field, and including:
    circuitry to separate a match line of data into a segmented match line (SML) connected to said first data field in said CAM and a main match line (ML) connected to said second data field in said CAM,
    circuitry to selectively provide and use new comparison results or old comparison results on said SML,
    circuitry to compare new comparison data inputted to the SML with data in the first data field of said CAM and indicate a "hit" or "miss" with respect to inputted new comparison data,
    circuitry to store the most recent previously inputted new comparison data on said SML,
    circuitry to compare data in said second data field of said CAM with comparison data imputed to said ML,
    comparison circuitry to control a "hit" or "miss" ML on the SML with respect to the comparison results of the SML, and
    circuitry to combine the output of the SML with the output of the ML for determining a "hit" or "miss" of the data in the entire CAM.

2. The invention as defined in claim 1 wherein the circuitry to selectively provide and use new comparison results or old comparison results includes a latch to latch the old comparison results.

3. The invention as defined in claim 2 wherein said latch is configured to selectively pass new comparison data or old comparison data.

4. The invention as defined in claim 3 wherein the latch selectively passes old or new comparison data to the ML.

5. The invention as defined in claim 2 wherein the old and new comparison data are clocked by a clock out of said latch.

6. The invention as defined in claim 1 wherein said first data field is a data field common to a plurality of addresses.

7. The invention as defined in claim 1 wherein both the SML and ML are active high.

8. The invention as defined in claim 1 wherein the comparison data is delivered to and from comparison data circuitry.

9. The invention as defined in claim 1 wherein ripple through comparison circuitry is used for new comparison data.

10. A method of addressing a content addressable memory (CAM) having a first data field and a second data field, and including circuitry to separate a match line of data into a segmented match line (SML) connected to said first data field in said CAM and a main match line (ML) connected to said second data field in said CAM, comprising the steps of: selectively providing and using new comparison results or old comparison results on said SML to compare new comparison data inputted to the SML with data in the first data field of said CAM, and indicate a "hit" or "miss" with respect to inputted new comparison data, storing the most recent previously inputted new comparison data on said SML, comparing data in said second data field of said CAM with comparison data inputted to said ML, comparing a "hit" or "miss" ML on the SML with respect to the comparison results of the SML, and combining the output of the SML with the output of the ML for determining a "hit" or "miss" of the data in the entire CAM.

11. The invention as defined in claim 10 wherein the comparison results of old comparison results are maintained in a latch to latch the old comparison results.

12. The invention as defined in claim 1 wherein said latch is configured to selectively pass new comparison data or old comparison data.

13. The invention as defined in claim 12 wherein the latch selectively passes old or new comparison data to the ML.

14. The invention as defined in claim 11 wherein the old and new comparison data are clocked out of said latch.

15. The invention as defined in claim 10 wherein said first data field is a data field common to a plurality of addresses.

16. The invention as defined in claim 10 wherein both the SML and ML are active high.

17. The invention as defined in claim 10 wherein the comparison data is delivered to and from comparison data circuitry.

18. The invention as defined in claim 10 wherein ripple through comparison is used for new comparison data.

* * * * *

UNITED STATES PATENT AND TRADEMARK OFFICE
CERTIFICATE OF CORRECTION

PATENT NO. : 7,079,409 B2  Page 1 of 1
APPLICATION NO. : 10/899358
DATED : July 18, 2006
INVENTOR(S) : Chai et al.

It is certified that error appears in the above-identified patent and that said Letters Patent is hereby corrected as shown below:

Column 6, line 28, change "1" to --11--.

Signed and Sealed this

Third Day of October, 2006

JON W. DUDAS
*Director of the United States Patent and Trademark Office*